(12) United States Patent
Nagatomo

(10) Patent No.: US 7,499,480 B2
(45) Date of Patent: Mar. 3, 2009

(54) PHOTONIC CRYSTAL STRUCTURE AND SURFACE-EMITTING LASER USING THE SAME

(75) Inventor: Yasuhiro Nagatomo, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/936,837

(22) Filed: Nov. 8, 2007

(65) Prior Publication Data

US 2008/0117941 A1 May 22, 2008

(30) Foreign Application Priority Data

Nov. 16, 2006 (JP) .............. 2006-310382
Oct. 5, 2007 (JP) .............. 2007-262271

(51) Int. Cl.
*H01S 5/00* (2006.01)
*H01S 3/08* (2006.01)
*H01S 3/082* (2006.01)

(52) U.S. Cl. ............ 372/50.124; 372/92; 372/97; 372/98

(58) Field of Classification Search ............ 372/50.124, 372/92, 97–99
See application file for complete search history.

(56) References Cited

U.S. PATENT DOCUMENTS

| | | | |
|---|---|---|---|
| 5,784,400 A * | 7/1998 | Joannopoulos et al. | 372/96 |
| 6,597,721 B1 * | 7/2003 | Hutchinson et al. | 372/98 |
| 6,674,778 B1 * | 1/2004 | Lin et al. | 372/46.01 |
| 6,711,200 B1 * | 3/2004 | Scherer et al. | 372/64 |
| 6,744,804 B2 * | 6/2004 | Deng et al. | 372/92 |
| 7,126,975 B2 * | 10/2006 | Iwasaki et al. | 372/69 |
| 7,386,205 B2 * | 6/2008 | Wang et al. | 385/37 |
| 2002/0048422 A1 * | 4/2002 | Cotteverte et al. | 385/4 |
| 2002/0163947 A1 * | 11/2002 | Ostergaard et al. | 372/43 |
| 2004/0228592 A1 * | 11/2004 | Gaeta et al. | 385/125 |
| 2005/0008060 A1 * | 1/2005 | Lipson et al. | 372/99 |
| 2007/0030873 A1 * | 2/2007 | Deng | 372/50.11 |
| 2007/0036189 A1 * | 2/2007 | Hori et al. | 372/50.11 |

OTHER PUBLICATIONS

Hamza Kurt, et al., "Annular photonic crystals", Optics Express, vol. 13, No. 25, 10316-10326 (2005).
A. Rosenberg, et al., "Guided resonances in asymmetrical GaN photonic crystal slabs observed in the visible spectrum", Optics Express, vol. 13, No. 17, 6564-6571 (2005).
Zhi-Yuan Li, et al., "Light propagation in semi-infinite photonic and related waveguide structures", Physical Review B, vol. 68, 155101, 1-14 (2003).

* cited by examiner

*Primary Examiner*—Minsun Harvey
*Assistant Examiner*—Phillip Nguyen
(74) *Attorney, Agent, or Firm*—Fitzpatrick, Cella, Harper & Scinto

(57) ABSTRACT

A structure includes a photonic crystal layer which has a first member having a first refractive index and having a surface with a plurality of holes periodically arranged therein, and includes a low-refractive-index layer adjacent to the photonic crystal layer and having a second refractive index that is lower than the first refractive index. The relative refractive index difference between the first refractive index and the second refractive index is 0.10 or lower. Third members having a third refractive index that is higher than 1.0 are disposed in the holes.

11 Claims, 10 Drawing Sheets

PHOTONIC CRYSTAL STRUCTURE AND SURFACE-EMITTING LASER USING THE SAME

BACKGROUND OF THE INVENTION

1. Field of the Invention

The present invention relates to a structure including a photonic crystal and a surface-emitting laser including the structure.

2. Description of the Related Art

In *Optics Express*, vol. 13, No. 17, 6564 (2005), guided-mode resonance in a photonic crystal illustrated in FIG. 8 is discussed.

As shown in FIG. 8, a photonic crystal layer 8050 is disposed on a sapphire substrate 8000 and has a GaN layer 8010, a nucleation layer (AlN) 8030, and holes 8020 periodically arranged in the GaN layer 8010.

"Guided-mode resonance" is a phenomenon in which guided-mode light propagating in a planar direction of a photonic crystal having a photonic periodic structure in the planar direction couples with the radiation mode light and is thereby emitted to the exterior of the photonic crystal.

This guided-mode resonance allows the photonic crystal to be used as a mirror. Light incident perpendicular to the surface of the photonic crystal can be converted to waveguide mode light in the photonic crystal through a coupling with a mode that exists above a light line. Then, this light is emitted to the outside of the photonic crystal through the coupling with the radiation mode. Optical interference between directly reflected light without the coupling with the waveguide mode light and emitted light coupled with waveguide mode light results in specific reflection, i.e., total reflection without loss.

Generally, a "waveguide mode" refers to a condition under which light does not leak out of a photonic crystal layer while a "radiation mode" refers to a condition under which light leaks out of a photonic crystal layer.

The "light line" refers to a dispersion relation of transmission light in a medium adjacent to a waveguide layer (photonic crystal layer). This light line is shown in a linear line satisfying an equation w=ck/n (w: angular frequency, c: light velocity, n: refraction index, k: wave number). Generally, in a higher frequency region than the light line, light leaks easily.

The principle of the function of a mirror using guided-mode resonance is different from that of a mirror using a photonic band gap.

When light incident perpendicular to the photonic crystal layer, as shown in FIG. 8, is adjusted to have a spectrum in which reflectivity is significantly increased by the guided-mode resonance, the incident light is reflected with high reflectivity.

In the above-mentioned reference, changes in the guided-mode resonance are simulated by using as a simulation parameter the refractive index of the sapphire substrate 8000 (reflective index is 1.8), which is adjacent to the photonic crystal layer 8050 (reflective index of GaN is 2.37).

FIG. 9 is a graph showing a profile of the transmission spectrum of the guided-mode resonance. The abscissa denotes frequency and the ordinate denotes transmission rate. The refractive index of the substrate ("n" in the graph) is varied where the refractive index of the photonic crystal layer is constant.

With respect to FIG. 9, when the relative refractive index difference $\Delta n$ ($=(n_{phc}-n_{clad})/n_{phc}$) between the photonic crystal layer (refractive index is $n_{phc}$) and the substrate (refractive index is $n_{clad}$), which functions as a cladding layer disposed adjacent to the photonic crystal layer, becomes small, an occurrence of guided-mode resonance is suppressed.

Specifically, the relative refractive index difference between the photonic crystal layer and the substrate is about 0.24 (approximately 24%) where $n_{phc}$=2.37 and $n_{clad}$=1.8 ("n" in FIG. 9 corresponds to $n_{clad}$). In this case, guided-mode resonance can occur as shown in FIG. 9.

However, when the relative refractive index difference between the photonic crystal layer and the substrate is about 0.10 (approximately 10%) or lower, for example, $n_{phc}$=2.37 and $n_{clad}$=2.135, the occurrence of the guided-mode resonance is suppressed.

When the guided-mode resonance in the photonic crystal is applied to a laser cavity and the like as a mirror, it is often necessary to use a structure of a mirror having a very small relative refractive index difference between the photonic crystal layer and the cladding layer that is adjacent to the photonic crystal layer.

For example, air having a low refractive index can be used as a medium adjacent to a photonic crystal layer when a certain relative refractive index difference is desired between the photonic crystal layer and the medium that is adjacent to the photonic crystal layer. This "air gap," however, is not easy to make using a semiconductor lamination process. Therefore, in an application for optical devices, a structure in which guided-mode resonance can be induced is desired even in the case where a semiconductor material having a higher refractive index than that of air is disposed adjacent to the photonic crystal layer.

When a photonic crystal layer is applied to a cavity of a surface-emitting laser device that emits light having a wavelength of 670 nm as a substitute for a laminated film mirror, $Al_{0.5}Ga_{0.5}As$ (refractive index is 3.446) may be used as the photonic crystal layer and $Al_{0.93}Ga_{0.07}As$ (refractive index is 3.130) may be used as a cladding layer adjacent to the photonic crystal layer.

In this case, the relative refractive index difference $\Delta n(=(n_{phc}-n_{clad})/n_{phc})$ is about 9.2%. Since the structure described in *OPTICS EXPRESS*, vol. 13, No. 17, 6564 (2005) may not generate guided-mode resonance, it is difficult to use a photonic crystal layer instead of a laminated film mirror.

The present invention provides a structure that can generate guided-mode resonance, and provides a surface-emitting laser using the structure. The structure can generate the guided-mode resonance even if a relative refractive index difference is insufficient, for example, as in the case of using a GaN layer 8010 as the photonic crystal layer and the sapphire substrate 8000 as the layer adjacent to the GaN layer 8010.

SUMMARY OF THE INVENTION

The present invention provides a structure having a photonic crystal layer made of a first member having a first refractive index ($n_1$) and having a surface with a plurality of holes arranged periodically therein, a second member being disposed adjacent to the photonic crystal layer and having a second refractive index ($n_2$) that is lower than the first refractive index ($n_1$), third members having a third refractive index ($n_3$) that is higher than 1.0 and being disposed in the holes, wherein the relative refractive index difference ($=(n_1-n_2)/n_1$) between the first refractive index and the second refractive index is 0.10 or lower and gaps are formed between the first member and the third members.

According to the present invention, when a relative refractive index difference is insufficient, such as when the difference between the refractive index of a GaN layer 8010 constituting a photonic crystal layer and the refractive index of a sapphire substrate 8000 that is adjacent to the GaN layer 8010 is insufficient, a structure that can induce guided-mode resonance and a surface-emitting laser using the structure can be provided.

Further features of the present invention will become apparent from the following description of exemplary embodiments with reference to the attached drawings.

DESCRIPTION OF THE EMBODIMENTS

First Embodiment: Structure

A structure in accordance with the first embodiment will be described with reference to FIGS. 1, 2A, and 2B.

Figure 1:
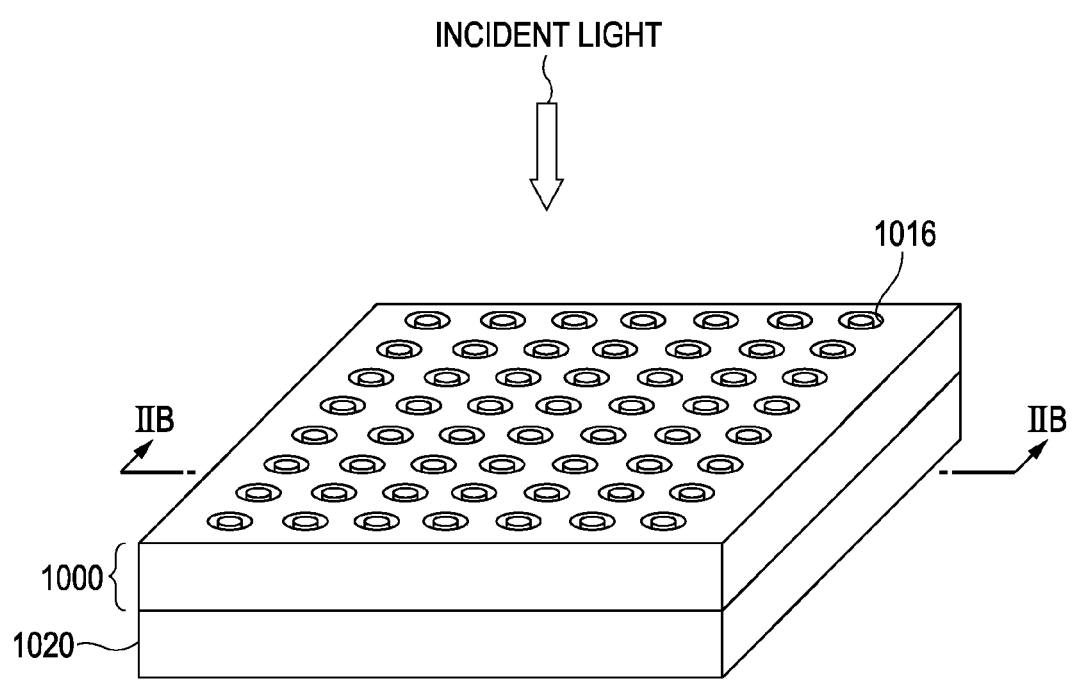
FIG. 1 is a perspective view illustrating a photonic crystal layer in accordance with the present invention.
Figure 2A:
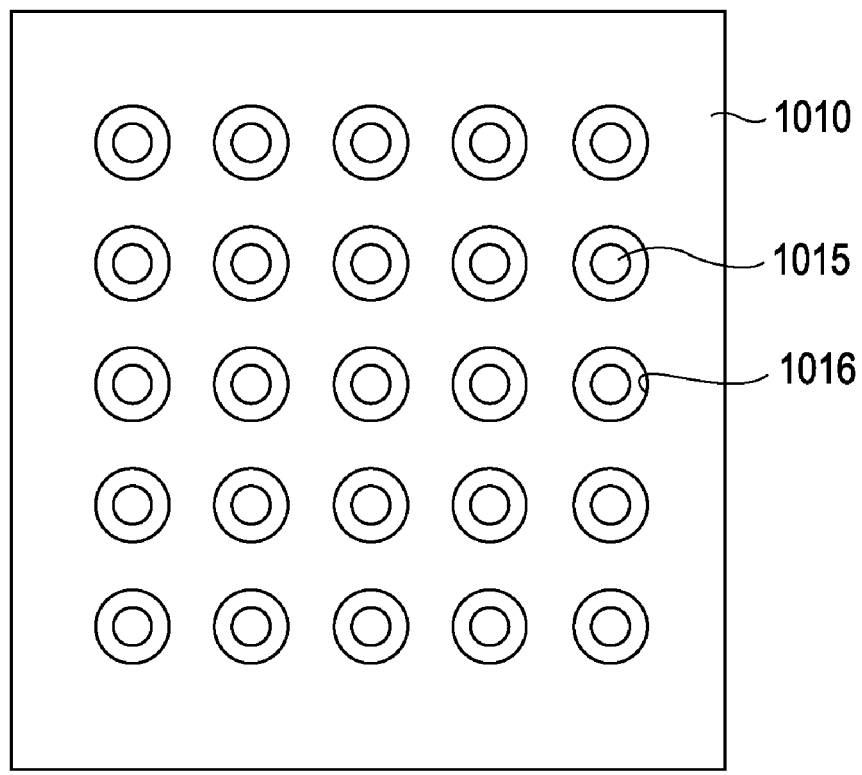
FIGS. 2A and 2B are a schematic plan view and a cross-sectional view, respectively, illustrating the photonic crystal layer in accordance with the present invention.
Figure 2B:
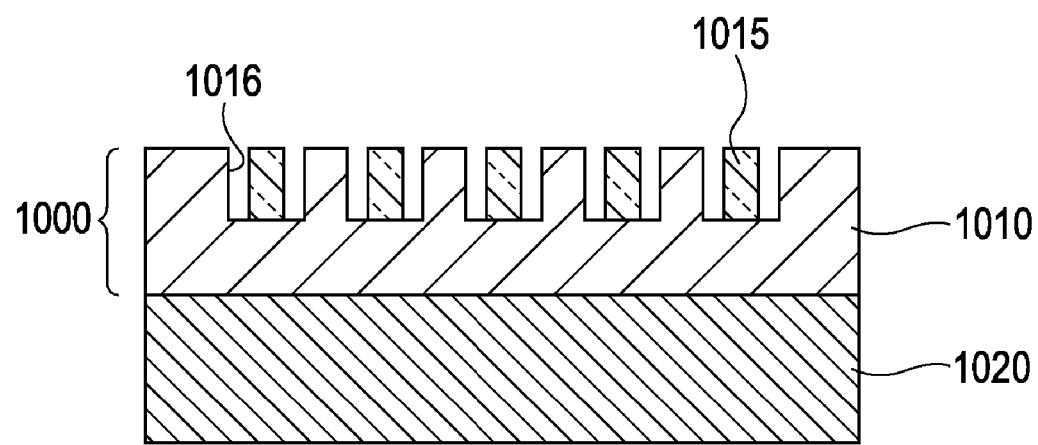

FIG. 2A is a plan view of the structure shown in FIG. 1, and FIG. 2B is a cross-sectional view taken from line IIB-IIB of FIG. 1.

In FIG. 1, a photonic crystal layer 1000 has a plurality of holes 1016 periodically arranged in a first member (1010 in FIG. 2A) made of a first material having a first refractive index ($n_1$).

The photonic crystal layer 1000 is disposed adjacent to a low-refractive-index layer 1020 made of a second material having a second refractive index ($n_2$) that is lower than that of the first refractive index ($n_1$) disposed adjacent to the photonic crystal layer 1000. The low-refractive-index layer 1020 is also referred to as "cladding layer".

The structure in accordance with the present embodiment is designed so as to reflect light incident perpendicular to the surface of the photonic crystal layer 1000 shown in FIG. 1. That is, the structure is designed to generate guided-mode resonance corresponding to the wavelength of the incident light. The light incident perpendicular to the surface of the photonic crystal layer 1000 is coupled with waveguide mode light in the photonic crystal layer 1000, and then the light is further coupled with radiation mode light so as to be emitted from the photonic crystal layer 1000. As a result, the photonic crystal layer 1000 functions as a mirror.

Note here that a relative refractive index difference $\Delta n (= (n_1-n_2)/n_1)$ between the first refractive index ($n_1$) and the second refractive index ($n_2$) is 0.10 or lower.

As already mentioned, in the case that $\Delta n$ is 0.10 or lower, guided-mode resonance is not easily generated as mentioned in *Optics Express*, vol. 13, No. 17, 6564 (2005).

In the present embodiment, however, third members 1015, having a third refractive index ($n_3$) that exceeds 1.0, are disposed in the holes 1016 as shown in FIGS. 1, 2A, and 2B.

Therefore, ring-shaped gaps are formed between the first member 1010 and the third members 1015 in the photonic crystal layer 1000.

The effective refractive index ($n_{eff}$) of the photonic crystal layer 1000 can be increased by use of the third members having a refractive index exceeding 1.0, which is the same refractive index as that of air. Thus, the relative refractive index difference between the photonic crystal layer 1000 and the low-refractive-index layer 1020 can be increased. According to the present invention, the effective refractive index of the photonic crystal layer 1000 that is lowered by formation of holes can be substantially increased. The internal diameter of the ring-shaped gap may be 50% or more and less than 100% of the external diameter. Further, it is more effective that the internal diameter of the ring-shaped gap be 80% or more and less than 100% of the external diameter.

The refractive index of the third members is not regulated as long as the refractive index is higher than 1.0. Taking the manufacturing process into consideration, the refractive index of the first member can be the same as that of the third members, that is, $n_1=n_3$. This structure can be achieved by the formation of the ring-shaped holes using etching for the first member 1010.

First Member, Second Member, etc.

The first refractive index $n_1$, of the first member, for example, may be from 1.2 to 4.0. Specifically, the material of the first member may be Si, $SiO_2$, SiN, GaAs, $Al_xGa_{1-x}As$, GaN, $Al_xGa_{1-x}N$, InP, or the like.

The second refractive index $n_2$ of the second member, for example, may be from 1.0 to 3.8. Specifically, the materials of the second member may be $SiO_2$, SiN, $Al_xGa_{1-x}As$, AlAs, $Al_xGa_{1-x}N$, AlN, or the like.

To make the relative refractive index difference $\Delta n$ between the first member and the second member be 0.10 or lower, for example, $Al_{0.5}Ga_{0.5}As$ is used for the first member and $Al_{0.93}Ga_{0.07}As$ is used for the second member.

The cross-sectional shape of the holes formed in the photonic crystal layer is circular, or rectangular, for example. The above-mentioned term "ring-shape" includes circular ring, rectangular ring, and the like.

For arrangement of the holes, there are quadrangular or trigonal arrangements in plan view.

A thickness $t$ of the first member is determined based on the waveguide mode and manufacturing conditions. For example, the thickness is in the range of 10 nm to 10 μm.

Second Embodiment: Vertical-Cavity Surface-Emitting Laser (VCSEL)

Figure 5:
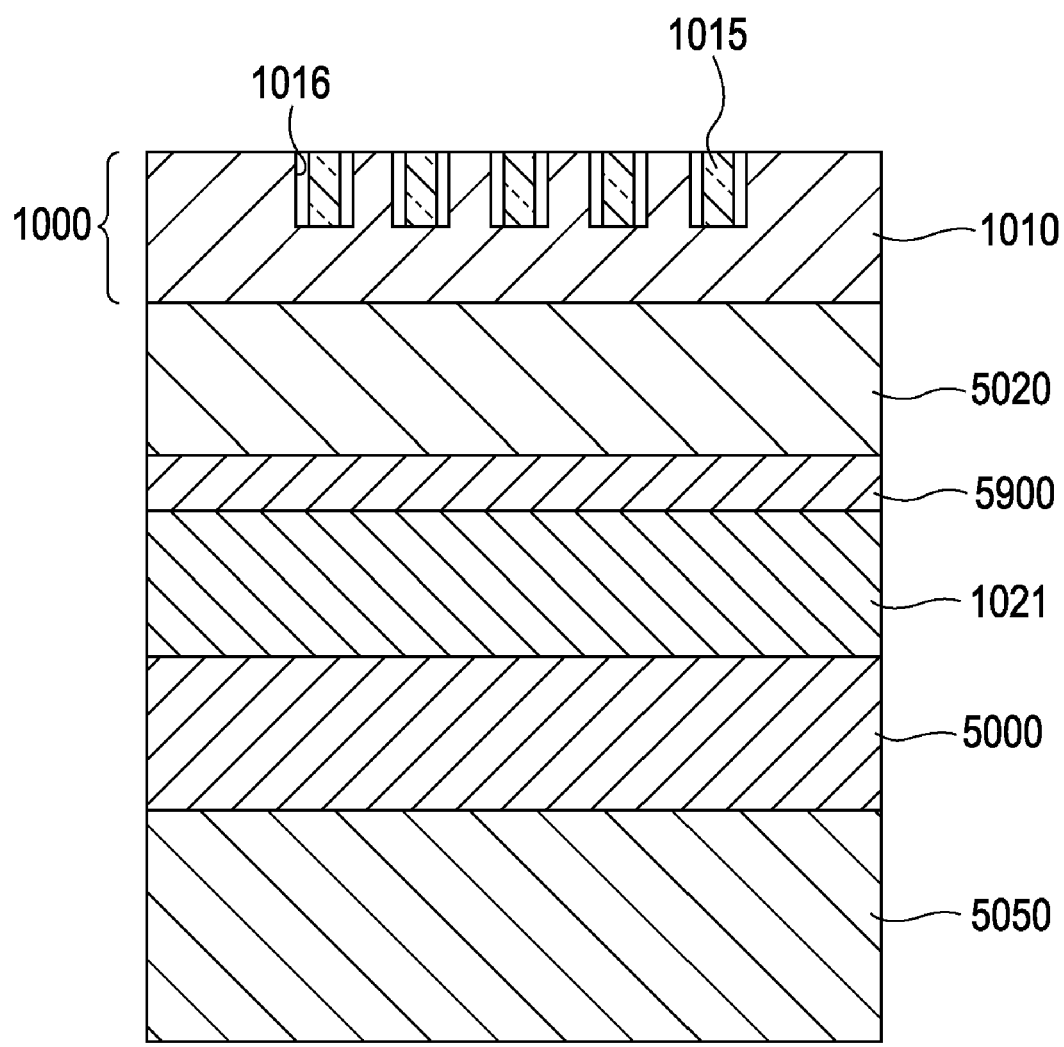
FIG. 5 is a schematic view of a VCSEL in accordance with the second embodiment.

Vertical-cavity surface-emitting laser (VCSEL) according to the present embodiment will be described. FIG. 5 is a schematic cross-sectional view of the VCSEL.

The VCSEL has a substrate 5050, a lower reflecting mirror 5000 (for example, a laminated film mirror), a lower cladding layer 1021, an active layer 5900, and an upper cladding layer 5020. The first member 1010 constitutes the photonic crystal layer 1000.

Note here that the technical descriptions in the first embodiment also apply to the photonic crystal layer 1000. The upper cladding layer 5020 in the present embodiment corresponds to the second member (low refractive index layer) 1020 in the first embodiment. That is, the upper cladding layer 5020 functions as the upper cladding layer disposed on the active layer 5900 and functions as the low-refractive-index layer for the photonic crystal layer 1000.

Laser oscillation of VCSEL is achieved by resonating light, which is generated in the active layer 5900, between the upper and lower mirrors so as to amplify the light. The wavelength of the emitted light generated in the active layer is determined in accordance with the material of the active layer and the structure of the layers of the laser device. Therefore, the laser should be designed such that the guided-mode resonance corresponding to the wavelength of the light emitted from the active layer occurs in the photonic crystal layer, which functions as the upper reflecting mirror.

As described above, a VCSEL can be made by allowing the photonic crystal layer 1000 described in the first embodiment to function as an upper reflecting mirror facing the lower reflecting mirror 5000 as shown in FIG. 5.

For the lower reflecting mirror, laminated mirrors such as $Al_xGa_{1-x}As/Al_xGa_{1-x'}As$, $GaN/Al_xGa_{1-x}N$, and $In_xGa_{1-x}As_yP_{1-y}/In_xGa_{1-x'}As_yP_{1-y'}$ can be used. Of course, a photonic crystal shown in the first embodiment can be used.

Active Layer, Cladding Layer, and Substrate

The active layer 5900 has a multiple quantum well structure made of GaInP/AlGaInP, GaN/InGaN, or the like.

The lower cladding layer 1021 is composed of AlGaInP or AlGaN, or the like.

The substrate 5050 is composed of GaAs or GaN, or the like.

A surface-emitting laser according to the present embodiment can be driven by optical pumping or current injection. Electrodes are not shown in FIG. 5. Note here that a mirror having the photonic crystal layer may be referred to as the first reflecting mirror, and a mirror facing the first reflecting mirror may be referred to as the second reflecting mirror. The first reflecting mirror may be used for the upper reflecting mirror as mentioned above, or may be used for the lower reflecting mirror.

Third Embodiment: Distributed Feed-Back (DFB) Surface-Emitting Laser

Figure 10:
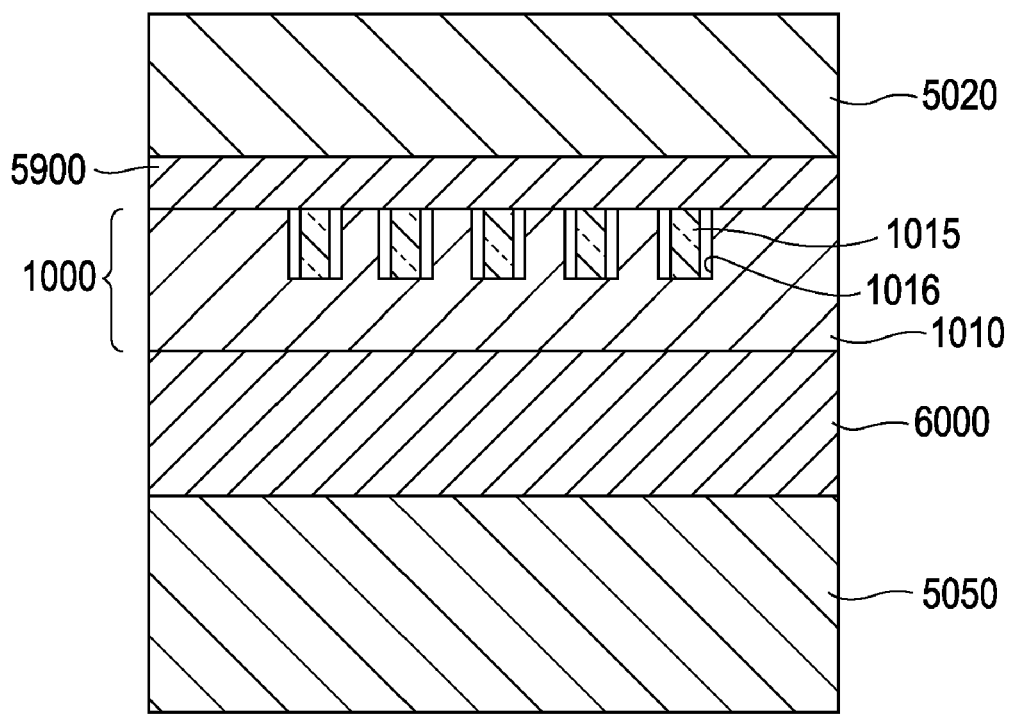
FIG. 10 is a schematic view illustrating a DFB laser in accordance with the third embodiment.

A distributed feed-back (DFB) surface-emitting laser according to the present embodiment will be described. FIG. 10 is a schematic cross-sectional view of the DFB laser.

The DFB laser has a substrate 5050, a cladding layer 6000, a first member 1010, third members 1015, holes 1016, a photonic crystal layer 1000, which is also referred to as "optical resonant layer", an active layer 5900, and an upper cladding layer 5020. The cladding layer 6000 functions as a low-refractive-index layer and as a second member for the photonic crystal layer 1000.

In the DFB surface-emitting laser device, generated light in the active layer 5900 enters the photonic crystal layer 1000. This incident light becomes waveguide mode light and is amplified by resonance in a planer direction of the photonic crystal layer 1000. Then, the amplified light is coupled with radiation mode and emitted to the exterior of the photonic crystal layer. As a result, coherent light is emitted from the surface of the upper cladding layer 5020.

That is, this embodiment differs from the second embodiment in that the lower reflecting mirror 5000 is not always required.

The second member described in the first embodiment may be used as the cladding layer 6000. The materials described in the first embodiment may also be used for the substrate 5050, the active layer 5900, and the like.

In the present embodiment, the active layer 5900 can be disposed at any position as long as light can enter an optical resonant layer, i.e., a photonic crystal layer 1000. To increase the gain, the active layer 5900 can be provided near the photonic crystal layer. For example, the active layer 5900 can be formed on or inside the photonic crystal layer 1000.

In the above explanation, the cladding layer 6000 functions as a low-refractive-index layer. The substrate 5050, however, can also be used as a low-refractive-index layer. Lasers having the photonic crystal layer 1000 on the substrate 5050 are included in the present invention.

EXAMPLES

Example 1

Mirror

Figure 3:
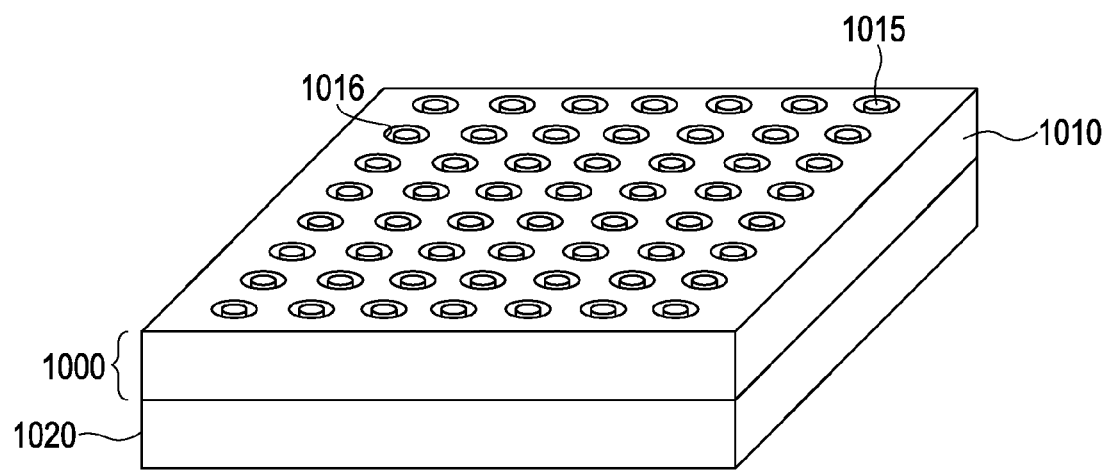
FIG. 3 is a schematic view illustrating a photonic crystal structure in accordance with Example 1.

In Example 1, a two-dimensional photonic crystal mirror manufactured using the present invention will be described. FIG. 3 shows a mirror of the present example.

As shown in FIG. 3, a photonic crystal layer 1000 made of GaN had ring-shaped holes disposed in a quadrangular arrangement. The thickness of the layer was 200 nm and the interval of the holes was 200 nm. The diameter of the outer circle of the ring-shaped holes (i.e., external diameter) was 180 nm and the diameter of the inner circle of the ring-shape holes (i.e., internal diameter) was 164 nm. The depth of the holes was 200 nm. Note that the diameter of the holes 1016 is also referred to as "external diameter" and the diameter of the third members 1015 is also referred to as "internal diameter".

A low-refractive-index layer 1020 was made of $Al_{0.4}Ga_{0.6}N$. In the present example, the material of a first member 1010 was the same as the material of third members 1015. That is, $n_1=n_3$.

Figure 4A:
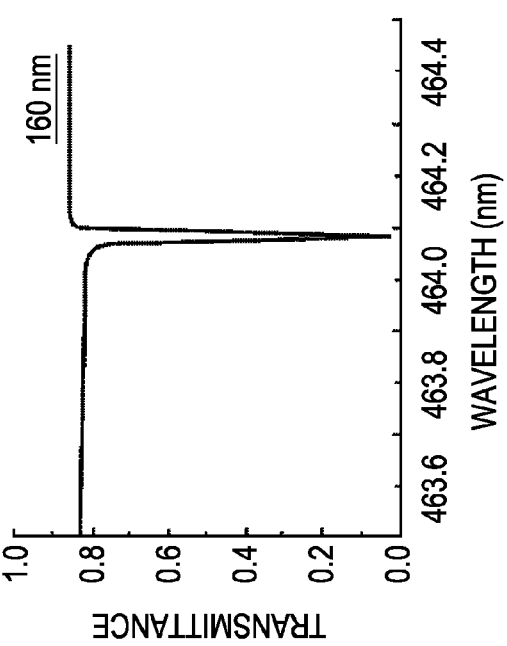
FIGS. 4A to 4C are graphs showing transmittance spectra of the photonic crystal structure in accordance with Example 1.

FIG. 4A shows a profile of the calculated transmittance spectrum of the device shown in FIG. 3. The calculation is performed under the assumption that the refractive indices of GaN and $Al_{0.4}Ga_{0.6}N$ are 2.54 and 2.32, respectively. The relative refractive index difference Δn between GaN and $Al_{0.4}Ga_{0.6}N$ is about 8.7%. Note that the first member 1010 and the low-refractive-index layer 1020 are assumed to be infinitely thick.

As shown in FIG. 4A, the profile of the transmittance spectrum shows a dip at a wavelength of 465.5 nm. This indicates the presence of a wavelength region in which reflectivity increases markedly. Therefore, this structure can be used as a mirror with high reflectivity.

Figure 4B:
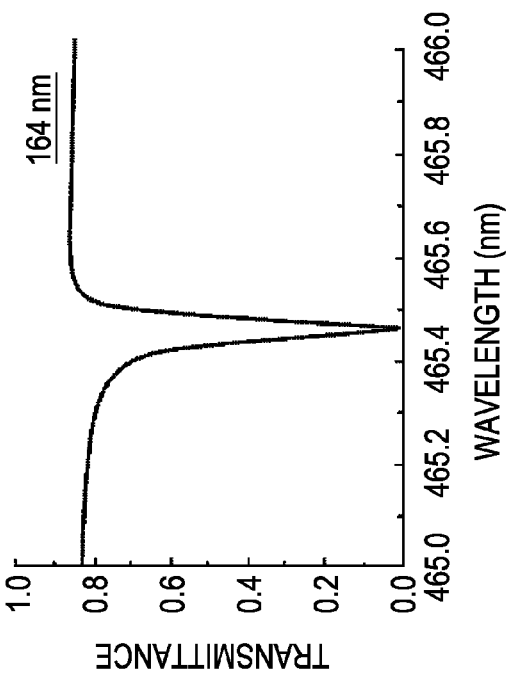
Figure 4C:
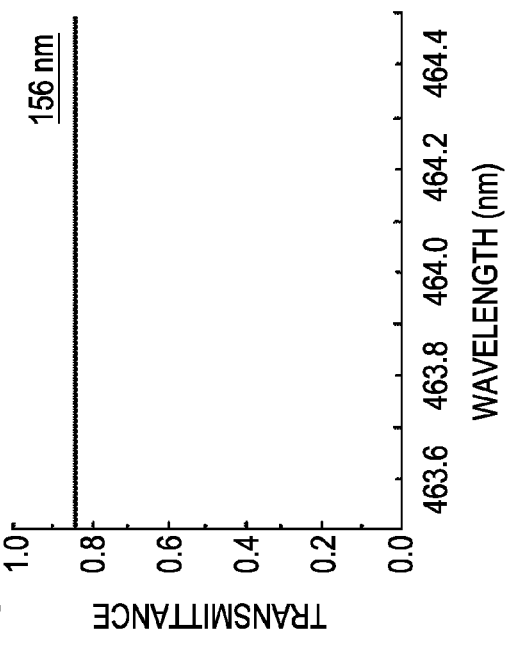

FIGS. 4B and 4C show the profiles of the calculated transmittances of structures having internal diameters of 160 nm (FIG. 4B) and 156 nm (FIG. 4C), respectively, both of the structures having the same external diameter of 180 nm as the structure in FIG. 4A.

As shown in FIG. 4B, guided-mode resonance is generated in the structure having an internal diameter of 160 nm. On the other hand, as shown in FIG. 4C, guided-mode resonance is not observed in the structure having an internal diameter of 156 nm. This means that the internal diameter should not be excessively small relative to outer diameter.

In the case shown in FIG. 4B, in which the internal diameter was 160 nm, the ratio of the internal diameter to the external diameter was 16:18 (about 88%). This suggests that the internal diameter of the ring-shaped hole can be 90% or more and less than 100% of the external diameter. In short, the width of the gaps between the first member and the third members may be 10% or less of the diameter of the holes formed in the first member.

This structure having such features (external diameter, thickness of layer, and refractive index) allows guided-mode resonance to exist and can function as a mirror when the internal diameter of the holes is larger than 160 nm.

Note that the above simulation was performed using a transfer matrix method described in *Physical Review B*, Vol. 68, 155101 (2003).

Example 2

VCSEL

Figure 6:
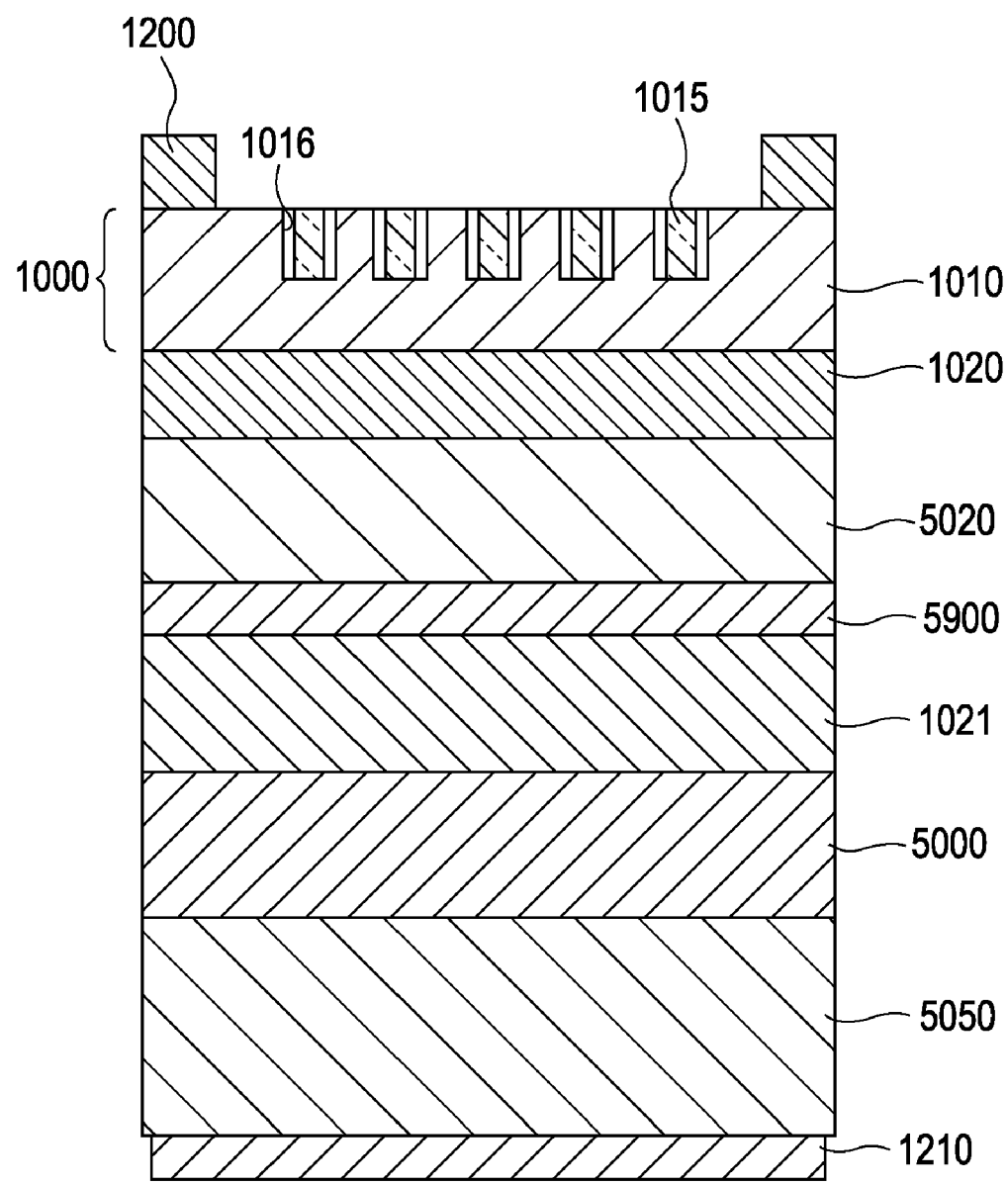
FIG. 6 is a schematic view illustrating a surface-emitting laser in accordance with Example 2.

In Example 2, a surface-emitting laser (VCSEL) manufactured using the present invention will be described. FIG. 6 shows the surface-emitting laser of the present example. As shown in FIG. 6, a photonic crystal layer 1000 made of $Al_{0.5}Ga_{0.5}As$ had holes 1016 disposed in a quadrangular arrangement. The thickness of the layer was 250 nm and the interval of the holes was 250 nm. The external diameter of the holes was 225 nm and the internal diameter of the holes was 210 nm. The depth of the holes was 250 nm.

The low-refractive-index layer 1020 was composed of $Al_{0.93}Ga_{0.07}As$, the upper cladding layer 5020 was composed of p-type AlGaInP, and the active layer 5900 had a multiple quantum well structure made of GaInP/AlGaInP.

The cladding layer 1021 was composed of n-type AlGaInP, the lower reflecting mirror layer 5000 was composed of n-type $Al_{0.93}Ga_{0.07}As/Al_{0.5}Ga_{0.5}As$-DBR, and the substrate 5050 was composed of GaAs. A first electrode 1210 and a ring-shaped second electrode 1200 were also provided.

Figure 7:
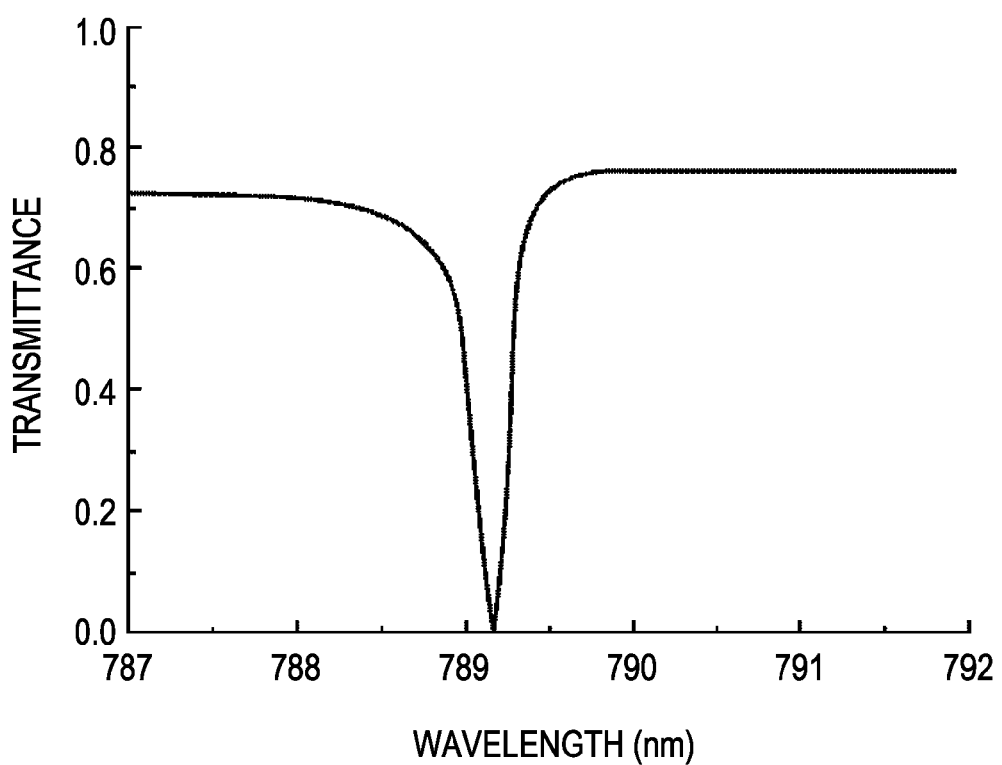
FIG. 7 is a graph showing a transmittance spectrum of a photonic crystal mirror constituting the surface-emitting laser in accordance with Example 2.
Figure 8:
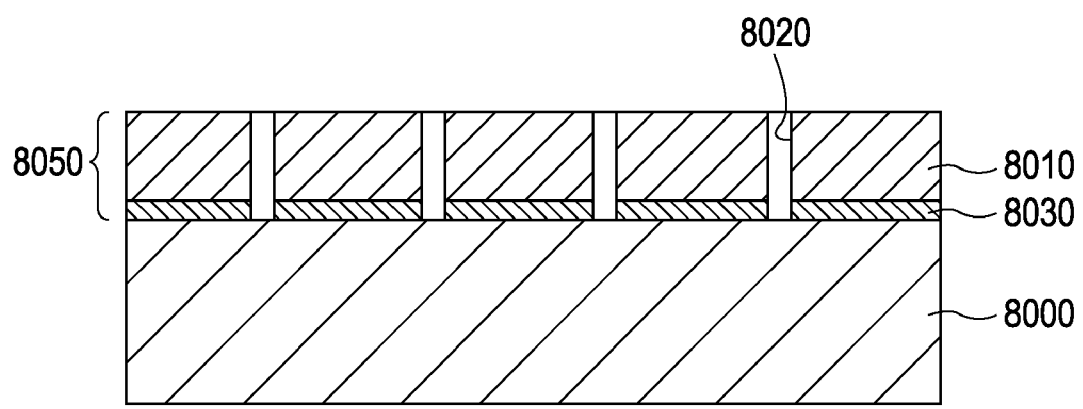
FIG. 8 is a cross-sectional view of a photonic crystal disclosed in *Optics Express*, vol. 13, No. 17, 6564 (2005).
Figure 9:
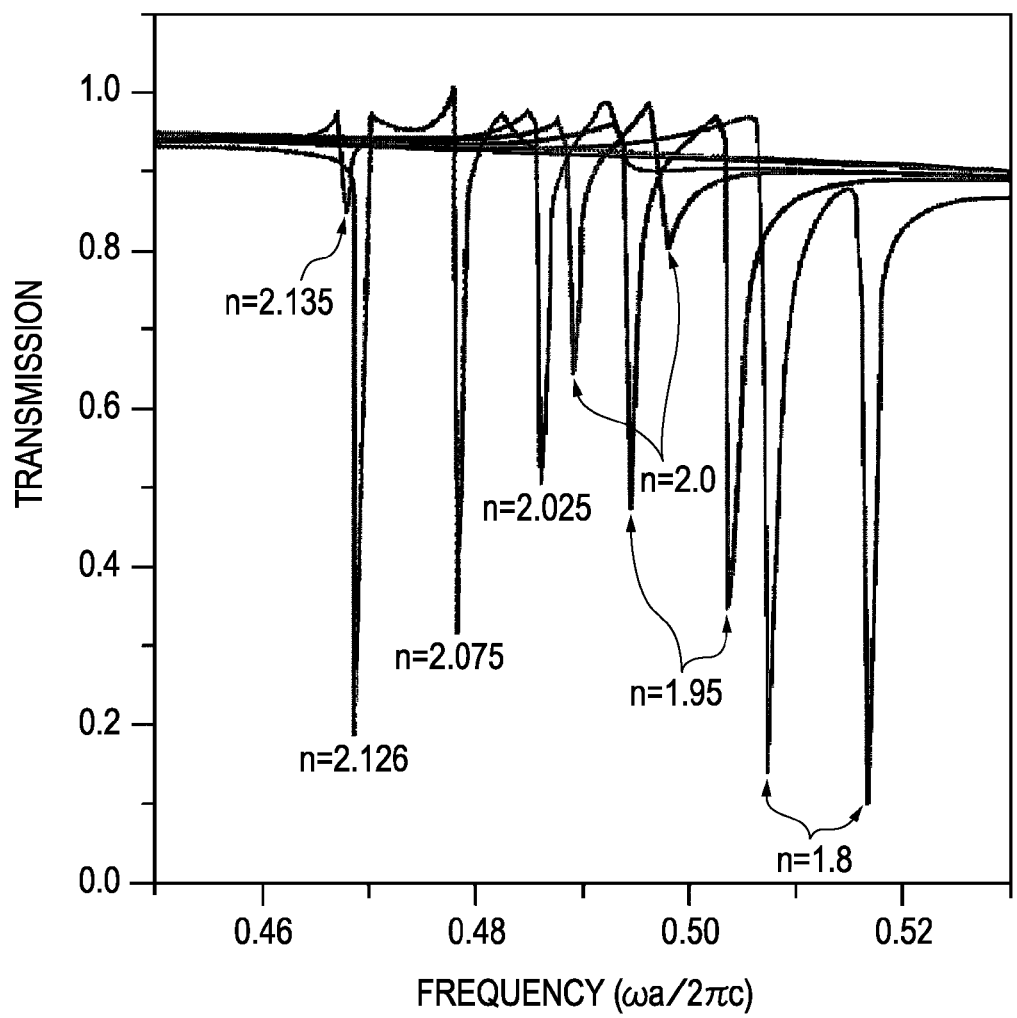
FIG. 9 is a graph showing transmission spectra disclosed in *Optics Express*, vol. 13, No. 17, 6564 (2005).

FIG. 7 shows the profile of the calculated transmittance spectrum of the photonic crystal layer shown in FIG. 6. This indicates that the photonic crystal layer functions as a mirror having a high reflectivity near a wavelength of 789 nm.

The lower reflecting mirror 5000 was also designed to have a high reflectivity at a wavelength of about 789 nm. The cavity length between the photonic crystal layer 1000 and the lower reflecting mirror 5000 was set so as to produce a standing wave having an anti-node in the active layer 5900. The above-mentioned structure can be achieved using ordinary methods that are used to design surface-emitting lasers. According to this structure, light generated in the active layer 5900 was resonated between the upper and lower mirrors and amplified so as to achieve laser oscillation.

While the present invention has been described with reference to exemplary embodiments, it is to be understood that the invention is not limited to the such embodiments. The scope of the following claims is to be accorded the broadest interpretation so as to encompass all modifications, equivalent structures and functions.

This application claims the benefit of Japanese Application No. 2006-310382 filed Nov. 16, 2006 and Japanese Application No. 2007-262271 filed Oct. 5, 2007, which are hereby incorporated by reference herein in their entirety.

What is claimed is:

1. A structure comprising:
a photonic crystal layer including a first member having a first refractive index ($n_1$) and having a surface with a plurality of holes arranged periodically;
a second member adjacent to the photonic crystal layer and having a second refractive index ($n_2$) that is lower than the first refractive index ($n_1$); and
third members having a third refractive index ($n_3$) that is higher than 1.0, said third members being disposed in the holes,
wherein a relative refractive index difference (($n_1-n_2$)/$n_1$) between the first refractive index and the second refractive index is 0.10 or lower and gaps are formed between the first member and the third members.

2. The structure according to claim 1, wherein the gaps have a ring-shape.

3. The structure according to claim 1, wherein the first refractive index is equal to the third refractive index.

4. The structure according to claim 2, wherein a diameter of the third members is 90% or more and less than 100% of a diameter of the holes.

5. The structure according to claim 2, wherein a width of the gaps is 10% or less of a size of the holes in the first member.

6. The structure according to claim 1, wherein light that is guided in a planer direction of the photonic crystal layer is emitted from the photonic crystal layer.

7. A surface-emitting laser comprising:
a first reflecting mirror including the photonic crystal layer of claim 1;
a second reflecting mirror positioned in opposition to the first reflecting mirror; and
an active layer disposed between the first reflecting mirror and the second reflecting mirror.

8. The surface-emitting laser according to claim 7, wherein the second reflecting mirror includes the structure of claim 1.

9. A surface-emitting laser comprising:
an optical resonant layer including the structure of claim 1; and
an active layer disposed at a position so as to guide light into the optical resonant layer.

10. The surface-emitting laser according to claim 9, wherein the active layer is formed on the optical resonant layer.

11. The surface-emitting laser according to claim 9, wherein the active layer is formed in the optical resonant layer.

* * * * *